(12) United States Patent
Miyake

(10) Patent No.: US 9,197,189 B2
(45) Date of Patent: Nov. 24, 2015

(54) ACOUSTIC WAVE DEVICE

(75) Inventor: Takashi Miyake, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1182 days.

(21) Appl. No.: 13/172,972

(22) Filed: Jun. 30, 2011

(65) Prior Publication Data

US 2012/0001704 A1    Jan. 5, 2012

(30) Foreign Application Priority Data

Jul. 5, 2010   (JP) ................. 2010-152687

(51) Int. Cl.
| | |
|---|---|
| *H03H 9/54* | (2006.01) |
| *H03H 9/70* | (2006.01) |
| *H03H 9/00* | (2006.01) |
| *H03H 9/17* | (2006.01) |
| *H03H 9/58* | (2006.01) |
| *H03H 9/56* | (2006.01) |
| *H03H 9/60* | (2006.01) |

(52) U.S. Cl.
CPC ............ *H03H 9/0095* (2013.01); *H03H 9/178* (2013.01); *H03H 9/564* (2013.01); *H03H 9/583* (2013.01); *H03H 9/585* (2013.01); *H03H 9/605* (2013.01); *H03H 9/706* (2013.01)

(58) Field of Classification Search
CPC ..... H03H 9/0095; H03H 9/205; H03H 9/593; H03H 9/584; H03H 9/589; H03H 9/60; H03H 9/605; H03H 9/706; H03H 9/178; H03H 9/564; H03H 9/585
USPC ......................................... 333/133, 187–192
See application file for complete search history.

(56) References Cited

U.S. PATENT DOCUMENTS

| | | | | |
|---|---|---|---|---|
| 5,910,756 | A * | 6/1999 | Ella ............................... | 333/133 |
| 6,963,257 | B2 * | 11/2005 | Ella et al. ...................... | 333/133 |
| 7,515,018 | B2 * | 4/2009 | Handtmann et al. .......... | 333/133 |
| 7,548,140 | B2 * | 6/2009 | Jamneala et al. ............. | 333/189 |
| 7,554,427 | B2 * | 6/2009 | Matsumoto et al. .......... | 333/187 |
| 7,786,825 | B2 * | 8/2010 | Handtmann et al. .......... | 333/189 |
| 7,978,025 | B2 * | 7/2011 | Yokoyama et al. ........... | 333/133 |
| 8,063,718 | B2 * | 11/2011 | Ueda et al. .................... | 333/133 |
| 2004/0257172 | A1 * | 12/2004 | Schmidhammer et al. ... | 333/133 |
| 2005/0030126 | A1 | 2/2005 | Inoue et al. | |

(Continued)

FOREIGN PATENT DOCUMENTS

| | | | |
|---|---|---|---|
| DE | 10 2006 032 950 | * | 1/2008 |
| EP | 0 880 227 A2 | | 11/1998 |

(Continued)

OTHER PUBLICATIONS

Lakin et al., "Wide Bandwidth Thin Film BAW Filters," Proceedings 2004 IEEE Ultrasonics Symposium, 2004, 4 pages.

(Continued)

*Primary Examiner* — Barbara Summons
(74) *Attorney, Agent, or Firm* — Keating & Bennett, LLP

(57) ABSTRACT

An acoustic wave device includes resonator structures each including resonators arranged next to each other, and each of the resonator structures is excited in at least two vibration modes as the resonators thereof are coupled and resonate with each other. At least one of the resonator structures exhibits stronger resonance characteristics in one of the vibration modes than in the other vibration mode or modes within the filter band.

11 Claims, 27 Drawing Sheets

(56) References Cited

U.S. PATENT DOCUMENTS

| | | |
|---|---|---|
| 2005/0093396 A1 | 5/2005 | Larson, III et al. |
| 2007/0176710 A1 | 8/2007 | Jamneala et al. |
| 2007/0296521 A1 | 12/2007 | Schmidhammer |
| 2008/0007139 A1 | 1/2008 | Kawamura |
| 2008/0169884 A1 | 7/2008 | Matsumoto et al. |
| 2008/0272853 A1 | 11/2008 | Heinze et al. |
| 2008/0297278 A1* | 12/2008 | Handtmann et al. .......... 333/189 |

FOREIGN PATENT DOCUMENTS

| | | |
|---|---|---|
| JP | 11-088111 A | 3/1999 |
| JP | 2000-22493 * | 1/2000 |
| JP | 2002-217676 A | 8/2002 |
| JP | 2005-057332 A | 3/2005 |
| JP | 2005-137001 A | 5/2005 |
| JP | 2008-504756 A | 2/2008 |
| JP | 2008-505573 A | 2/2008 |
| JP | 2008-113061 A | 5/2008 |
| JP | 2008-172711 A | 7/2008 |
| WO | 2006/112260 A1 | 10/2006 |

OTHER PUBLICATIONS

Official Communication issued in corresponding Japanese Patent Application No. 2010-152687, mailed on Oct. 9, 2012.

* cited by examiner

ACOUSTIC WAVE DEVICE

BACKGROUND OF THE INVENTION

1. Field of the Invention

The present invention relates to acoustic wave devices, or more specifically, to acoustic wave devices including resonator structures each based on adjacent coupled resonators.

2. Description of the Related Art

There have been increasing demands for filters and duplexers able to function as an unbalanced-to-balanced transformer.

The stacked bulk acoustic wave (BAW) filter, which has resonator structures each based on stacked BAW resonators, carries out this transformation through vibrations in different modes. However, this type of filter is inferior in band-edge steepness.

As a solution to this, structures that connect a stacked BAW filter with monolayer BAW resonators have been proposed. The monolayer BAW resonators work in a single resonance mode and thereby ensure good filter steepness. A specific example is a circuit having a ladder filter and a stacked BAW filter connected in series.

For example, Lakin et al. introduced in their report a filter having a stacked BAW filter connected with monolayer BAW resonators in a circuit (see K. M. Lakin, C. W. Andrus, J. R. Belsick, K. T. McCarron and W. H. Thornhill, "Wide Bandwidth Thin Film BAW Filters", Proceedings 2004 IEEE Ultrasonics Symposium), and Japanese Unexamined Patent Application Publication No. 11-88111 has disclosed a filter and a duplexer having a stacked BAW filter and monolayer BAW resonators connected in a circuit.

However, for example, a filter combining a ladder filter and a stacked BAW filter connected in series should have stacked BAW filters and monolayer BAW resonators whose structure as viewed along the thickness direction is different from that of the stacked BAW filter, and these resonators and BAW filter should be connected with each other. As a possible constitution of this type of filter, comparative example 1 is illustrated in FIGS. 1 and 2. FIG. 1 illustrates the circuit of a filter, and FIG. 2 illustrates its schematic cross-sectional view.

As illustrated in FIGS. 1 and 2, this circuit has balanced-signal input/output terminals $2a$ and $2b$ and an unbalanced-signal input/output terminal 4, and a stacked BAW filter $10x$ and monolayer BAW resonators 6, 7, and 8 are arranged therebetween. The stacked BAW filter $10x$ is a resonator structure and has two BAW resonators $11a$ and $11b$ having the same structure, in which a piezoelectric substance (13 or 15) is sandwiched between two electrodes ($12a$ and $12b$, or $14a$ and $14b$). Coupled via an acoustic coupling layer 16, these two BAW resonators can resonate with each other. The monolayer BAW resonators 6, 7, and 8 also have the same structure, in which a piezoelectric substance ($6x$, $7x$, or $8x$) is sandwiched between two electrodes ($6a$ and $6b$, $7a$ and $7b$, or $8a$ and $8b$). These three monolayer BAW resonators can resonate independently of each other.

The circuit illustrated in FIGS. 1 and 2 is usually built on a single substrate. However, this usual way of circuit formation involves a costly process of making the stacked BAW filter $10x$ and the monolayer BAW resonators 6, 7, and 8 all have different frequencies and structures.

Stacked BAW filters alone can also make up a filter. A possible constitution of this type of filter is illustrated in FIGS. 3 and 4 (Comparative Example 2). FIG. 3 illustrates the circuit of a filter, and FIG. 4 illustrates its schematic cross-sectional view.

As illustrated in FIGS. 3 and 4, this circuit has terminals $2a$ and $2b$ and a terminal 4, and stacked BAW filters $10x$ and $20x$ are arranged therebetween. The stacked BAW filter $20x$ is a resonator structure and has the same structure as that of its counterpart $10x$, and has two BAW resonators $21a$ and $21b$, in which a piezoelectric substance (23 or 25) is sandwiched between two electrodes ($22a$ and $22b$, or $24a$ and $24b$). Coupled via an acoustic coupling layer 26, these two BAW resonators can resonate with each other.

The filter circuit illustrated in FIGS. 3 and 4 can be formed in fewer steps because the layer formation process is common to both the stacked BAW filters $10x$ and $20x$.

This constitution, however, also has a problem in that the low band-edge steepness of the stacked BAW filters $10x$ and $20x$ leads to reduced overall steepness.

SUMMARY OF THE INVENTION

In order to overcome the problems described above, preferred embodiments of the present invention provide acoustic wave devices that provide excellent band-edge steepness despite including only resonator structures each based on adjacent coupled resonators.

The following are example constitutions of acoustic wave devices according to various preferred embodiments of the present invention.

In a preferred embodiment of the present invention, an acoustic wave device includes a plurality of resonator structures. Each of the resonator structures includes a plurality of resonators arranged next to each other, and the resonators are coupled and resonate with each other. In this way, the resonator structures can be excited in at least two vibration modes. Electrical wiring is arranged to allow at least one of the resonator structures to exhibit stronger resonance characteristics in one of the vibration modes than in the other vibration mode or modes within a filter band.

At least one of the resonator structures according to the above-described preferred embodiments of the present invention provides improved band-edge steepness. For example, single-mode resonator(s) connected to a multiple-mode filter based on other resonator structures improves band-edge steepness. In a preferred embodiment of the present invention, each resonator preferably is a piezoelectric thin-film resonator including a pair of electrode films and a piezoelectric thin film disposed between the pair of electrode films, and each resonator structure includes a stacked BAW device including the piezoelectric thin-film resonators stacked in a direction of lamination of the electrode films and the piezoelectric thin film. This preferred embodiment allows stacked BAW devices alone to define an acoustic wave device that achieves improved band-edge steepness.

Preferably, one of the stacked BAW devices is electrically connected with the resonators of the other stacked BAW device or devices. This allows stacked BAW devices alone to constitute a circuit that provides improved steepness. In this circuit, one of the stacked BAW devices defines a multiple-mode stacked BAW filter, and the resonators of the other(s) BAW devices define stacked BAW resonators.

In a preferred embodiment of the present invention, one of the stacked BAW devices and the resonators of the other stacked BAW device or devices are preferably connected in series. In this constitution, the resonators connected in series define a series resonator for the selected stacked BAW device, thereby improving the steepness at the upper edge of the filter band.

In another preferred embodiment of the present invention, one of the stacked BAW devices and the resonators of the other stacked BAW device or devices are preferably connected in parallel. In this constitution, the resonators connected in parallel define a parallel resonator for the selected stacked BAW device, thereby improving the steepness at the lower edge of the filter band.

In yet another preferred embodiment of the present invention, the stacked BAW devices preferably are connected in a ladder arrangement. This constitution provides a ladder filter that achieves improved steepness both at the lower and upper edges of the filter band.

In an additional preferred embodiment of the present invention, the stacked BAW devices are preferably connected in a lattice arrangement. This constitution provides a lattice filter that achieves reduced attenuation.

In another preferred embodiment of the present invention, one of the stacked BAW devices preferably is connected in series with another one of the stacked BAW devices on either an input side or an output side and in parallel with yet another one of the stacked BAW devices on the other side. This constitution achieves improved steepness both at the lower and upper edges of the filter band.

In a further preferred embodiment of the present invention, one or more layers of the stacked BAW devices preferably are made of substantially the same material and have substantially the same thickness as the corresponding layer or layers of each other. This constitution simplifies the fabrication process.

In another preferred embodiment of the present invention, every layer of the stacked BAW devices, except for one layer, is preferably made of substantially same the material and has substantially same the thickness as the corresponding layer of each other. This constitution makes it possible to form every layer in a single operation except for one. Only one layer needs modification of its material and thickness for frequency tuning, and the fabricating process is accordingly simplified.

In another preferred embodiment of the present invention, one or more but not all of the stacked BAW devices preferably include one or more additional layer, and every layer of the resonator structures is preferably made of substantially the same material and has substantially the same thickness as the corresponding layer of each other except for the additional layer or layers. This constitution makes it possible to form every layer in a single operation except for the additional layer(s). The selected resonator structures can have their frequency tuned simply by being provided additional layer(s) thereon, and the fabrication process is accordingly simplified.

In another preferred embodiment of the present invention, it is preferred that every layer of the stacked BAW devices is made of substantially the same material and has substantially the same thickness as the corresponding layer of each other. This constitution makes it possible to form every layer of the resonator structures (e.g., the first and second resonator structures) in a single operation and thereby simplifies the fabrication process.

In a further preferred embodiment of the present invention, the number of the piezoelectric thin-film resonators in each of the stacked BAW devices preferably is two. Two is the smallest number of piezoelectric thin films that can make up a stacked BAW device. This constitution thus simplifies the fabrication process.

In an additional preferred embodiment of the present invention, at least one of the stacked BAW devices preferably includes a short circuit between an inner one of the electrode films of a first of the piezoelectric thin-film resonators and an outer one of the electrode films of a second of the piezoelectric thin-film resonators; and another short circuit between the outer one of the electrode films of the first of the piezoelectric thin-film resonators and the inner one of the electrode films of the second of the piezoelectric thin-film resonators. This constitution allows the selected stacked BAW device(s) to exhibit resonance characteristics in the asymmetric mode.

In another preferred embodiment of the present invention, at least one of the stacked BAW devices preferably includes a short circuit between an outer one of the electrode films of a first of the piezoelectric thin-film resonators and an outer one of the electrode films of a second of the piezoelectric thin-film resonators; and another short circuit between the inner one of the electrode films of the first of the piezoelectric thin-film resonators and the inner one of the electrode films of the second of the piezoelectric thin-film resonators. This constitution allows the selected stacked BAW device(s) to exhibit resonance characteristics in the symmetric mode.

In another preferred embodiment of the present invention, each of the resonator structures preferably includes the following: (a) a piezoelectric thin film; (b) a first electrode including two or more first electrode fingers located on a first principal plane of the piezoelectric thin film; (c) a second electrode including two or more second electrode fingers located on a second principal plane of the piezoelectric thin film and facing the first electrode fingers across the piezoelectric thin film; (d) a third electrode including two or more third electrode fingers located on the first of the principal planes and alternating with the first electrode fingers with some distance therebetween; and (e) a fourth electrode including two or more fourth electrode fingers located on the second of the principal planes, facing the third electrode fingers across the piezoelectric thin film, and alternating with the second electrode fingers with a space therebetween. Each of the resonator structures preferably is a flat BAW device, one of the resonators includes the piezoelectric thin film, the first electrode, and the second electrode, and the other of the resonators includes the piezoelectric thin film, the third electrode, and the fourth electrode. This preferred embodiment allows flat BAW devices alone to define an acoustic wave device that provides improved band-edge steepness.

Preferably, one of the flat BAW devices is electrically connected with the resonators of the other flat BAW device or devices. This allows flat BAW devices alone to define a circuit that provides improved steepness. In this circuit, one of the flat BAW devices defines a multiple-mode flat BAW filter, and the resonators of the others define flat BAW resonators.

In another preferred embodiment of the present invention, one of the flat BAW devices and the resonators of the other flat BAW device or devices preferably are connected in series. In this constitution, the resonators connected in series define a series resonator for the selected one flat BAW device, thereby improving the steepness at the upper edge of the filter band.

In a further preferred embodiment of the present invention, one of the flat BAW devices and the resonators of the other flat BAW device or devices preferably are connected in parallel. In this constitution, the resonators connected in parallel define a parallel resonator for the selected one flat BAW device, thereby improving the steepness at the lower edge of the filter band.

In yet another preferred embodiment of the present invention, the flat BAW devices preferably are connected in a ladder arrangement. This constitution provides a ladder filter that features improved steepness both at the lower and upper edges of the filter band.

In another preferred embodiment of the present invention, the flat BAW devices preferably are connected in a lattice arrangement. This constitution provides a lattice filter that achieves a reduced attenuation.

In an additional preferred embodiment of the present invention, one of the flat BAW devices preferably is connected in series with another one of the flat BAW devices on either an input or output side and in parallel with yet another one of the flat BAW devices on the other side. This constitution achieves improved steepness both at the lower and upper edges of the filter band.

In all of the various preferred embodiments and constitutions described above, the resonator structures are preferably disposed on a single substrate, for example. This simplifies the fabrication process.

In all of the various preferred embodiments and constitutions described above, it is also preferred that either one of the input and output terminals is balanced, whereas the other is unbalanced. This allows the acoustic wave device to function as a balanced-to-unbalanced or unbalanced-to-balanced transformer.

The present invention includes and provides further preferred embodiments, for example, a duplexer either or both of whose transmitting and receiving filters have an acoustic wave device according to any of the preferred embodiments and constitutions described above.

In one of its possible constitutions, the duplexer is preferably based on a bulk wave construction and defines a balanced-to-unbalanced or balanced-to-unbalanced transformer, and thus has excellent performance.

Overall, various preferred embodiments of the present invention provide acoustic wave devices that achieve excellent band-edge steepness despite being defined only by resonator structures each based on adjacent coupled resonators.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes various preferred embodiments of the present invention with reference to FIGS. 5 to 27.
Preferred Embodiment 1

The following describes filters (acoustic wave devices) according to Preferred Embodiment 1 with reference to FIGS. 5 to 11.

A major element of the filters according to Preferred Embodiment 1 is a stacked BAW device.

Figure 5:
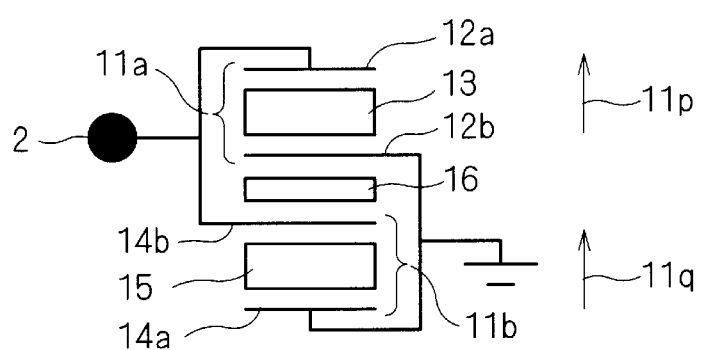
FIG. 5 illustrates electrical wiring of a stacked BAW device according to Preferred Embodiment 1 of the present invention.
Figure 6:
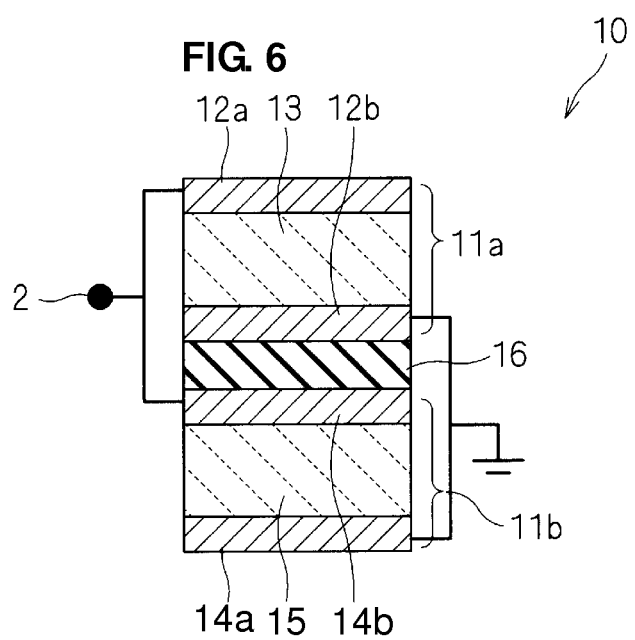
FIG. 6 illustrates a schematic cross-sectional view of a stacked BAW device according to Preferred Embodiment 1 of the present invention.
Figure 7:
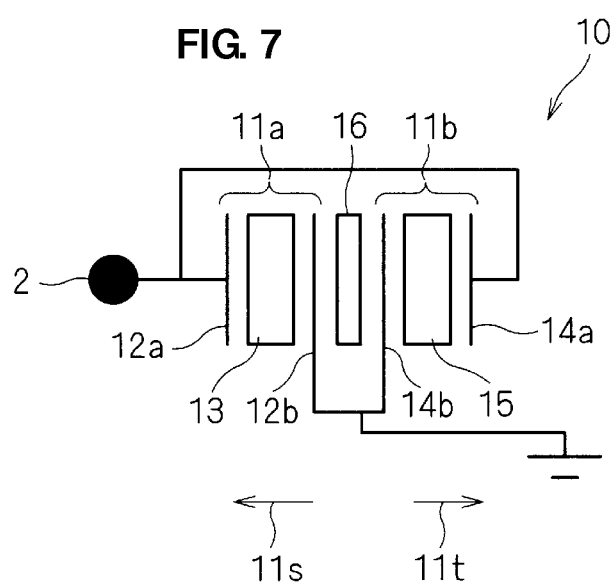
FIG. 7 illustrates electrical wiring of another type of a stacked BAW device according to Preferred Embodiment 1 of the present invention.
Figure 8:
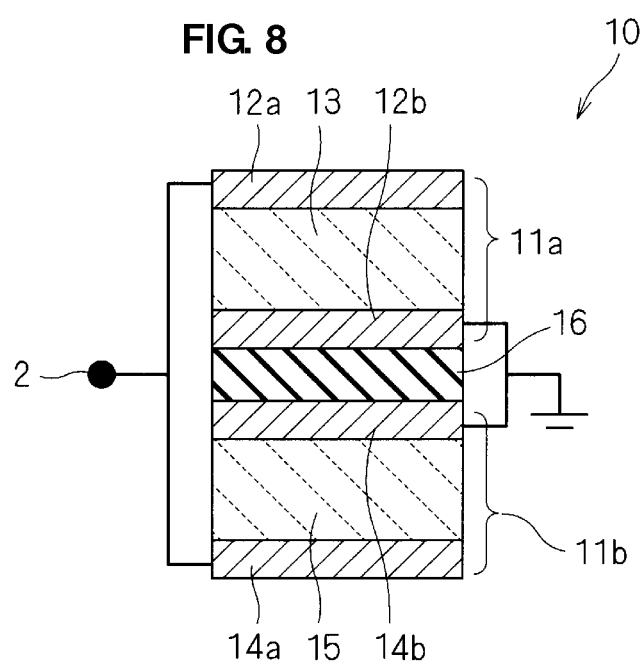
FIG. 8 illustrates a schematic cross-sectional view of a stacked BAW device according to Preferred Embodiment 1 of the present invention.

FIG. 5 illustrates electrical wiring of a stacked BAW device, and FIG. 6 illustrates a schematic cross-sectional view of this stacked BAW device. FIG. 7 illustrates electrical wiring of another type of stacked BAW device, and FIG. 8 illustrates a schematic cross-sectional view of this stacked BAW device.

As illustrated in FIGS. 5 to 8, a stacked BAW device 10 includes first and second resonators 11a and 11b, and an acoustic coupling layer 16.

The first and second resonators 11a and 11b preferably have the same constitution; each preferably includes two electrodes (12a and 12b, or 14a and 14b) and a piezoelectric substance (13 or 15) sandwiched between the electrodes (12a and 12b, or 14a and 14b). The first and second resonators 11a and 11b are stacked in the thickness direction (the direction of lamination of the electrodes 12a and 12b, or 14a and 14b and the piezoelectric substance 13 or 15) with the acoustic coupling layer 16 being inserted therebetween. The electrodes 12a, 12b, 14a, and 14b include metal films, and the piezoelectric substances 13 and 15 include piezoelectric thin films. The acoustic coupling layer 16 is preferably made of resin or any other insulating material.

As the resonators 11a and 11b are coupled and resonate with each other, the stacked BAW device 10 can be excited in at least two vibration modes.

As can be seen from FIGS. 5 to 8, the vibration mode of the stacked BAW device 10 can be asymmetric or symmetric depending on the electrical wiring between the electrodes 12a and 12b of the first resonator 11a and the electrodes 14a and 14b of the second resonator 11b.

More specifically, the electrical wiring illustrated in FIGS. 5 and 6 is for asymmetric vibrations as the arrows 11p and 11q represent. This wiring arrangement includes a short circuit between the outer electrode 12a of the first resonator 11a and the inner electrode 14b of the second resonator 11b and another short circuit between the inner electrode 12b of the first resonator 11a and the outer electrode 14a of the second resonator 11b. For example, the outer electrode 12a of the first resonator 11a and the inner electrode 14b of the second resonator 11b are connected to a terminal 2, whereas the inner electrode 12b of the first resonator 11a and the outer electrode 14a of the second resonator 11b are grounded.

On the other hand, the electrical wiring illustrated in FIGS. 7 and 8 is for symmetric vibrations as the arrows 11s and 11t represent. This wiring arrangement includes a short circuit between the outer electrode 12a of the first resonator 11a and the outer electrode 14a of the second resonator 11b and another short circuit between the inner electrode 12b of the first resonator 11a and the inner electrode 14b of the second resonator 11b. For example, the outer electrode 12a of the first resonator 11a and the outer electrode 14a of the second resonator 11b are connected to a terminal 2, whereas the inner electrode 12b of the first resonator 11a and the inner electrode 14b of the second resonator 11b are grounded.

Figure 9A:
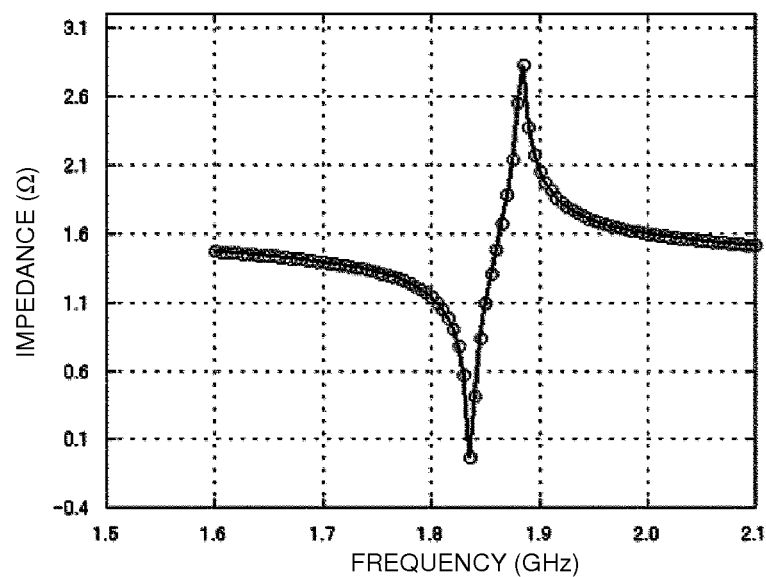
FIGS. 9A and 9B illustrate impedance and displacement profiles of a stacked BAW device according to Preferred Embodiment 1 of the present invention, which is for asymmetric vibrations.
Figure 9B:
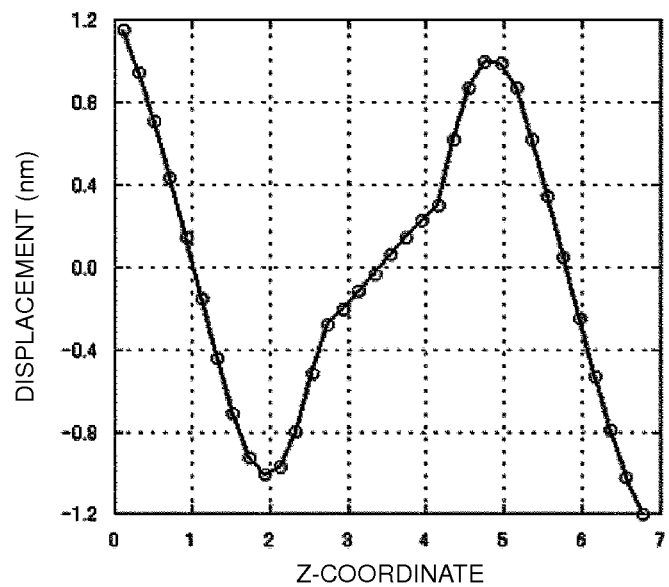

FIGS. 9A and 9B illustrate typical characteristics of a stacked BAW device assembled for asymmetric vibrations as illustrated in FIGS. 5 and 6 (resonance frequency: 1835 MHz). FIG. 9A illustrates an impedance profile, whereas FIG. 9B illustrates a distribution of displacements in the thickness direction.

Figure 10A:
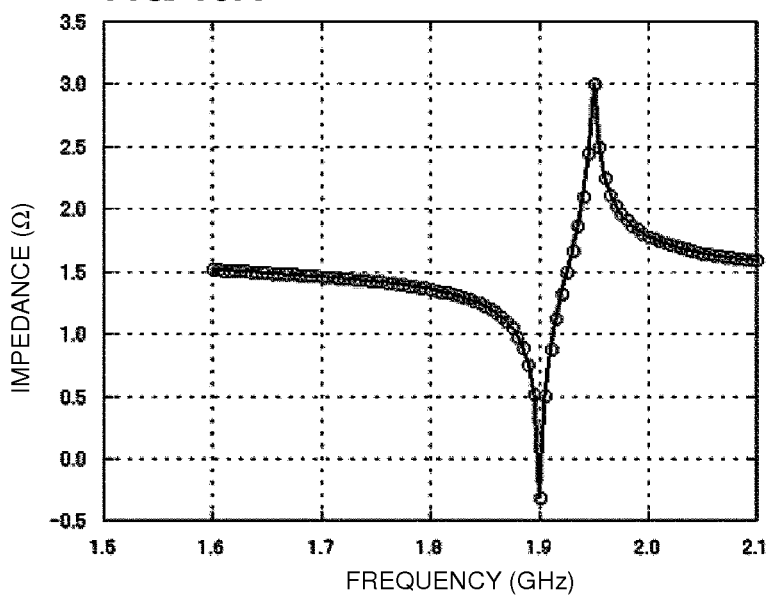
FIGS. 10A and 10B illustrate impedance and displacement profiles of another type of stacked BAW device according to Preferred Embodiment 1 of the present invention, which is for symmetric vibrations.
Figure 10B:
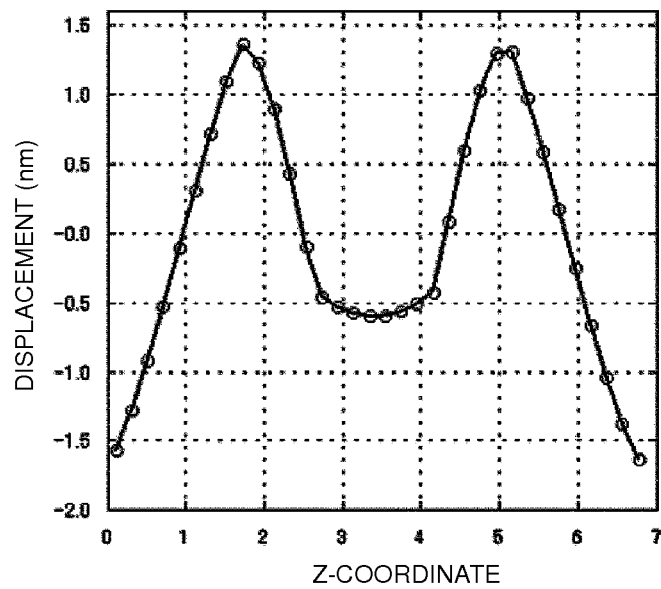

FIGS. 10A and 10B illustrate typical characteristics of a stacked BAW device assembled for symmetric vibrations as illustrated in FIGS. 7 and 8 (resonance frequency: 1900 MHz). FIG. 10A illustrates an impedance profile, whereas FIG. 10B illustrates a distribution of displacements in the thickness direction.

As can be seen from FIGS. 9A, 9B, 10A, and 10B, these arrangements of electrical wiring, one for asymmetric vibrations and the other for symmetric vibrations, allow the resonators 11a and 11b of the stacked BAW device 10 to behave like monolayer BAW resonators, which resonate independently of each other. This means that the resonators 11a and 11b of the stacked BAW device can be used as monolayer BAW resonators. The filters according to Preferred Embodiment 1 preferably use resonators of a stacked BAW device as monolayer BAW resonators.

Figure 11:
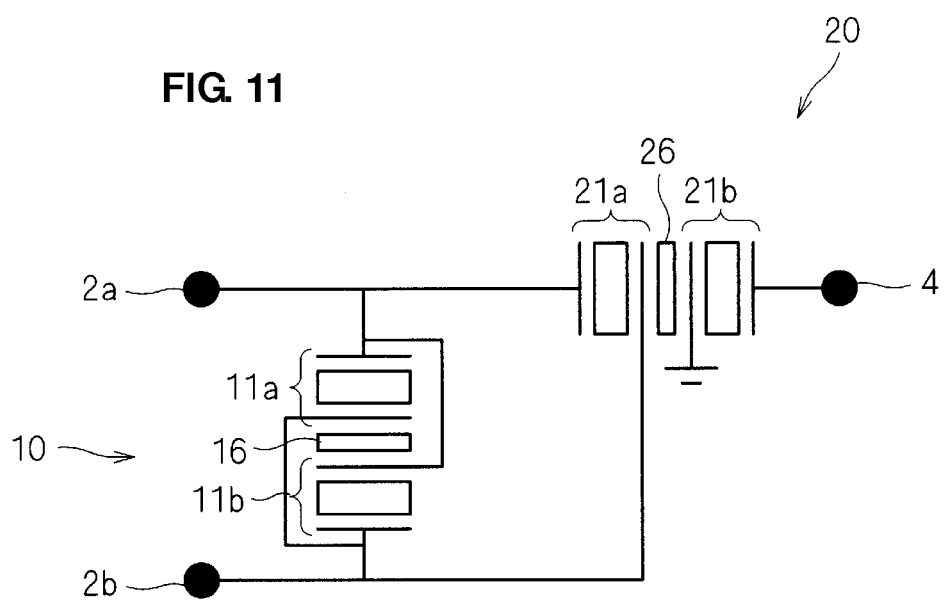
FIG. 11 illustrates electrical wiring of stacked BAW devices according to Preferred Embodiment 1 of the present invention.
Figure 12:
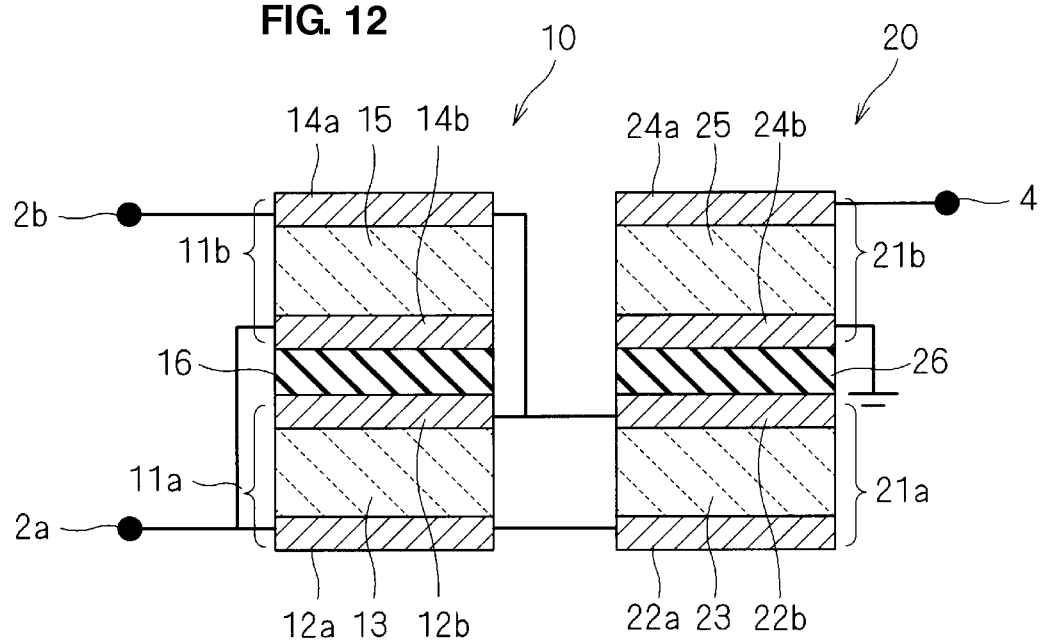
FIG. 12 illustrates a schematic cross-sectional view of stacked BAW devices according to Preferred Embodiment 1 of the present invention.

The following describes a filter constitution according to Preferred Embodiment 1 with reference to FIGS. 11 and 12. FIG. 11 illustrates electrical wiring of stacked BAW devices in this filter constitution, and FIG. 12 illustrates a schematic cross-sectional view of these stacked BAW devices.

As illustrated in FIGS. 11 and 12, the resonators 11a and 11b of a first stacked BAW device 10 are connected as parallel resonators to a second stacked BAW device 20, which defines a filter, and in shunt to the ground.

A more detailed explanation of this constitution is as follows. A terminal 2a, which is provided to input or output balanced signals, is connected to the following three electrodes: the outer electrode 12a of the first resonator 11a and the inner electrode 14b of the second resonator 11b of the first stacked BAW device 10, and the outer electrode 22a of the first resonator 21a of the second stacked BAW device 20. Another terminal 2b, which is also provided to input or output balanced signals, is connected to the following three electrodes: the inner electrode 12b of the first resonator 11a and the outer electrode 14a of the second resonator 11b of the first stacked BAW device 10, and the inner electrode 22b of the first resonator 21a of the second stacked BAW device 20. There is yet another terminal, a terminal 4, which is provided to output or input unbalanced signals, and this terminal is connected to the outer electrode 24a of the second resonator 21b of the second stacked BAW device 20. And, the inner electrode 24b of the second resonator 21b of the second stacked BAW device 20 is grounded.

The electrical wiring of the first stacked BAW device 10 is arranged to allow the device to exhibit stronger resonance characteristics in one of its vibration modes than in the other (s) within the filter band. In other words, this electrical wiring is for asymmetric vibrations. This constitution thus achieves improved steepness at the lower edge of the filter band, by using the first and second resonators 11a and 11b of the stacked BAW device 10 as a parallel resonator.

A stacked BAW device has a lower resonance frequency in wiring arrangements for asymmetric vibrations than in those for symmetric vibrations. It is therefore desirable that the first stacked BAW device 10, which is for use as a parallel resonator, includes a wiring arrangement for asymmetric vibrations as illustrated in FIGS. 11 and 12.

In forming the layers of the first and second stacked BAW devices 10 and 20, each layer is preferably formed on a single substrate in a single operation. In other words, every layer of the first stacked BAW device 10 is preferably made of substantially the same material and has substantially the same thickness as the corresponding layer of the second stacked BAW device 20. This contributes to the downsizing of finished electric components.

FIG. 12 helps provide an understanding of this. In this drawing, the layers of the first and second stacked BAW devices 10 and 20 preferably include the following seven layers: the lowermost electrodes 12a and 22a, the lower piezoelectric substances 13 and 23, the second lowermost electrodes 12b and 22b, the acoustic coupling layers 16 and 26, the second uppermost electrodes 14b and 24b, the upper piezoelectric substances 15 and 25, and the uppermost electrodes 14a and 24a. Each of these seven layers is preferably formed on a single substrate in a single operation.

Actually, the whole fabrication process of the stacked BAW devices 10 and 20 can be simplified when at least one of the layers of these devices is made of substantially the same material and has substantially the same thickness as the corresponding layer(s) of each other.

A possible constitution for this approach is that every layer of the stacked BAW device 10 except for one layer is made of substantially the same material and has substantially the same thickness as the corresponding layer of the stacked BAW device 20. This constitution makes it possible to form every layer in a single operation except for one. Only one layer needs modification of its material and thickness for resonance frequency tuning, and the whole fabricating process is accordingly simplified.

Another possible constitution for the above-described approach is that only one of the stacked BAW devices 10 and 20 has at least one additional layer, and every layer of the devices is made of substantially the same material and has substantially the same thickness as the corresponding layer of each other, except for the additional layer(s). This constitution makes it possible to form every layer in a single operation except for the additional layer(s). The selected device can have its frequency tuned simply by being provided additional layer(s) thereon, and the whole fabrication process is accordingly simplified.

For example, the frequency difference between the second stacked BAW device 20, which defines a filter, and the first stacked BAW device 10, which defines a stacked BAW resonator, can be fine-tuned by adding a frequency difference tuning layer to either device. This possibility of fine-tuning the device characteristics provides improved overall design flexibility.

As described above, the stacked BAW devices 10 and 20 each preferably include two resonators (11*a* and 11*b*, or 21*a* and 21*b*) and a piezoelectric thin film (16 or 26), for example. In other words, these devices are minimum-configuration stacked BAW devices, having the smallest possible number of layers. This also contributes to simplifying the whole fabrication process.

Furthermore, the filters according to Preferred Embodiment 1 can work without monolayer BAW resonators, whose structure as seen along the thickness direction is different from that of stacked BAW filters, and thus can be fabricated at a reduced cost.

Moreover, this type of filter can also define an impedance converter when different impedances are set on the input and output sides of the stacked BAW devices.

In Preferred Embodiment 1, one of the input and output terminals, the terminal 4, is for unbalanced signals, whereas the other, the terminals 2*a* and 2*b*, is for balanced signals. However, filter constitutions that allow balanced or unbalanced signals to pass with no conversion are also possible.

A duplexer whose transmitting or receiving filter is a filter according to Preferred Embodiment 1 will be advantageous in that it can function as a balanced-to-unbalanced or unbalanced-to-balanced transformer making use of BAWs. In this type of duplexer, the resonators of the stacked BAW devices can also define impedance matching elements for the transmitting and receiving filters in addition to their primary role as resonators.

The following describes some modifications of Preferred Embodiment 1 (Modifications 1 to 10) with reference to FIGS. 13 to 22.

Modification 1

Figure 13:
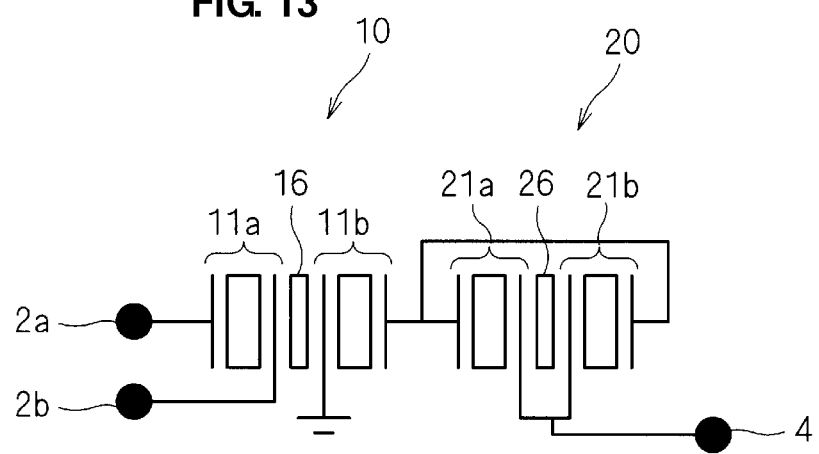
FIG. 13 illustrates electrical wiring of stacked BAW devices according to Modification 1 of a preferred embodiment of the present invention.

Modification 1 is described with reference to FIGS. 13 and 14. FIG. 13 illustrates electrical wiring of stacked BAW devices according to this modification, and FIG. 14 illustrates a schematic cross-sectional view of these stacked BAW devices.

The constitution of Modification 1 is almost the same as that of Preferred Embodiment 1. The following thus focuses on differences between the two constitutions. Note that like numerals reference like numbers in Preferred Embodiment 1 and this and following modifications.

Figure 14:
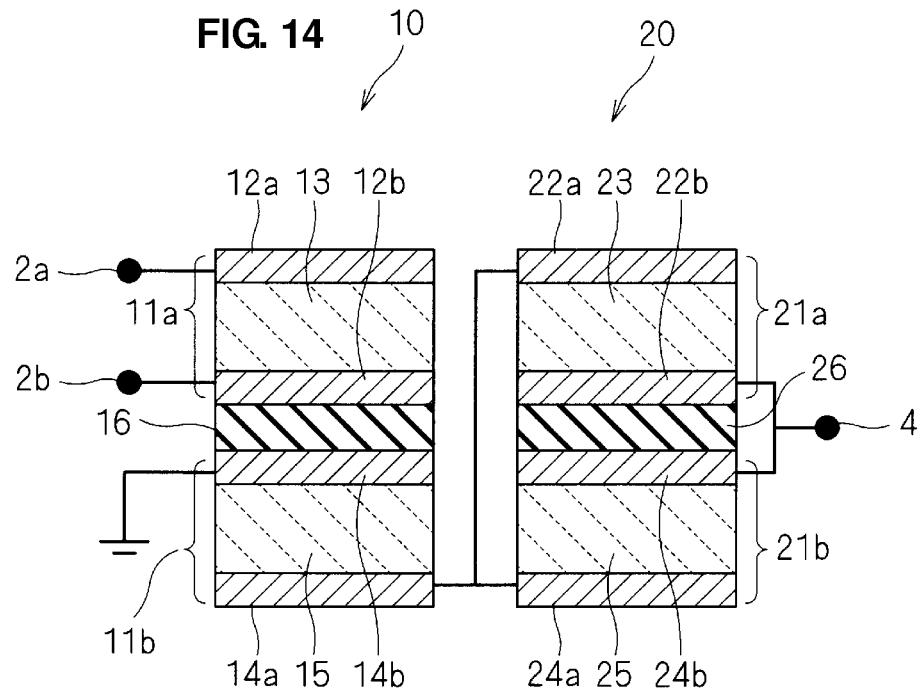
FIG. 14 illustrates a schematic cross-sectional view of stacked BAW devices according to Modification 1 of a preferred embodiment of the present invention.

As illustrated in FIGS. 13 and 14, first and second stacked BAW devices 10 and 20 are preferably connected in series. The resonators 21*a* and 21*b* of the second stacked BAW device 20 define a series resonator for the first stacked BAW device 10, which defines a filter. In other words, the filter, namely the first stacked BAW device 10, and the resonators 21*a* and 21*b* of the second stacked BAW device 20 are preferably connected in series.

As described above, a stacked BAW device has a lower resonance frequency in wiring arrangements for asymmetric vibrations than that in those for symmetric vibrations. It is therefore desirable in this modification that the second stacked BAW device 20, which is preferably for use as a series resonator, has a wiring arrangement for symmetric vibrations as illustrated in FIGS. 13 and 14.

The constitution illustrated in FIGS. 13 and 14 achieves improved steepness at the upper edge of the filter band.

Modification 2

Figure 15:
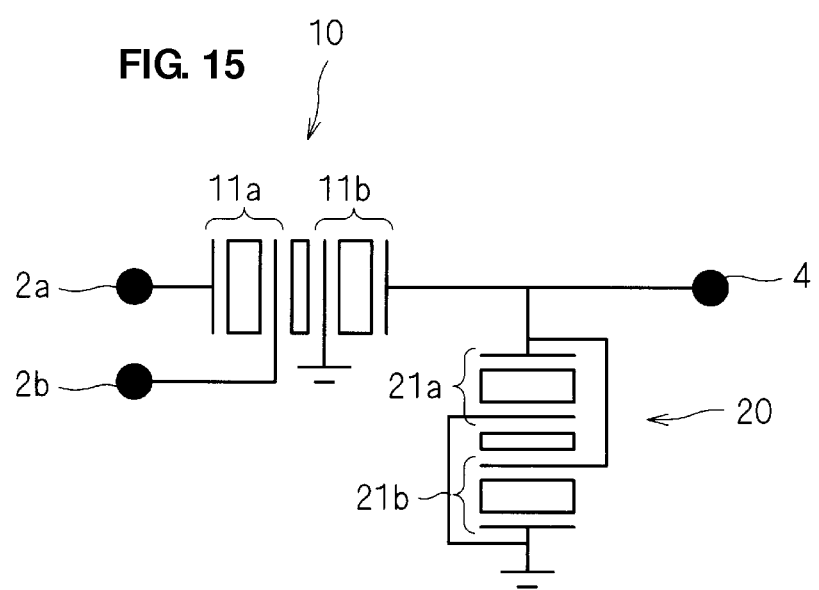
FIG. 15 illustrates electrical wiring of stacked BAW devices according to Modification 2 of a preferred embodiment of the present invention.

Modification 2 is described with reference to FIG. 15. FIG. 15 illustrates electrical wiring according to this modification.

As illustrated in FIG. 15, a first stacked BAW device is followed by a second stacked BAW device 20, and these devices are preferably connected in parallel. The resonators 21*a* and 21*b* of the second stacked BAW device 20 define a parallel resonator for the first stacked BAW device 10, which defines a filter.

As with Preferred Embodiment 1, in which a stacked BAW device defining a filter follows another stacked BAW device defining a parallel resonator, the constitution illustrated in FIG. 15 achieves improved steepness at the lower edge of the filter band.

Modification 3

Figure 16:
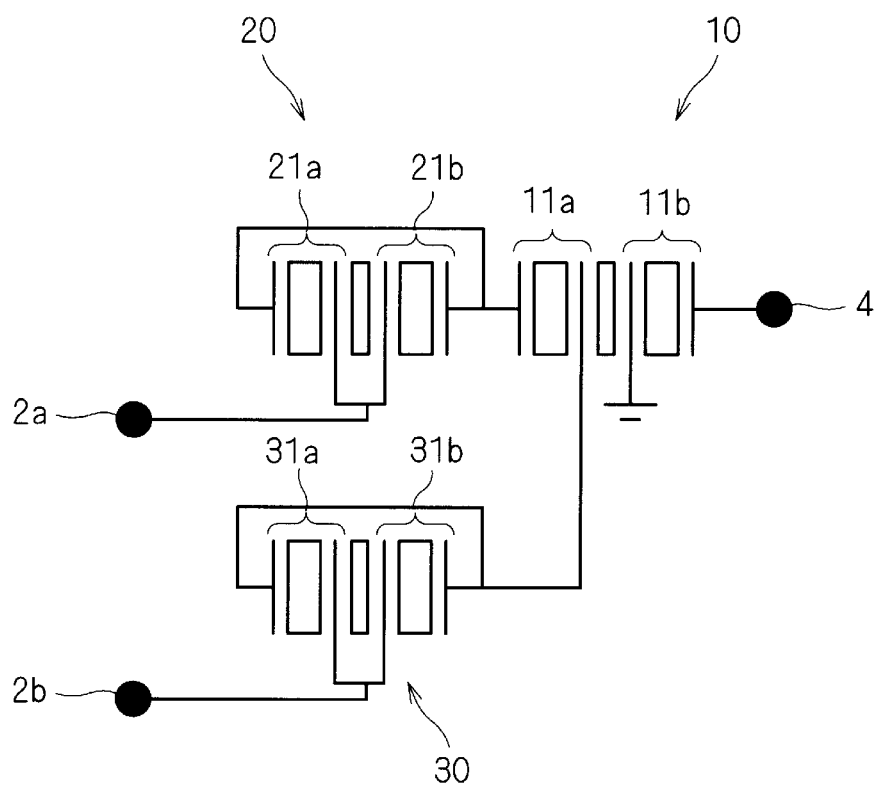
FIG. 16 illustrates electrical wiring of stacked BAW devices according to Modification 3 of a preferred embodiment of the present invention.

Modification 3 is described with reference to FIG. 16. FIG. 16 illustrates electrical wiring of stacked BAW devices according to this modification.

As illustrated in FIG. 16, a first stacked BAW device follows second and third stacked BAW devices 20 and 30 connected in series therewith. The resonators 21*a* and 21*b* of the second stacked BAW device 20 define a series resonator for the first stacked BAW device 10, and so do the resonators 31*a* and 31*b* of the third stacked BAW device 30.

As with Modification 1, in which a stacked BAW device defining a filter is followed by another stacked BAW device connected in series therewith, the constitution illustrated in FIG. 16 achieves improved steepness at the upper edge of the filter band.

Modification 4

Figure 17:
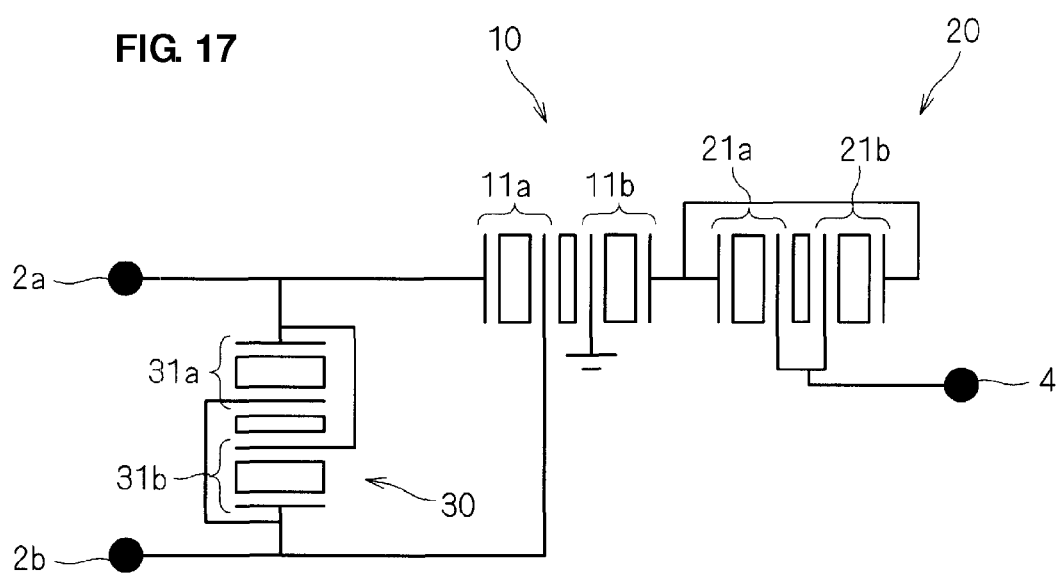
FIG. 17 illustrates electrical wiring of stacked BAW devices according to Modification 4 of a preferred embodiment of the present invention.

Modification 4 is described with reference to FIG. 17. FIG. 17 illustrates electrical wiring of stacked BAW devices according to this modification.

In FIG. 17, a first stacked BAW device 10 is followed by a second stacked BAW device 20 connected in series therewith and follows a third stacked BAW device 30 connected in parallel therewith. The resonators 21*a* and 21*b* of the second stacked BAW device 20 define a series resonator for the first stacked BAW device 10, which defines a filter. The resonators 31*a* and 31*b* of the third stacked BAW device 30 define a parallel resonator for the filter, the first stacked BAW device 10.

Constitutions like that illustrated in FIG. 17, in which a stacked BAW device is connected in series with another on either an input side or an output side and in parallel with yet another on the other side, achieve improved steepness both at the lower and upper edges of the filter band.

Modification 5

Figure 18:
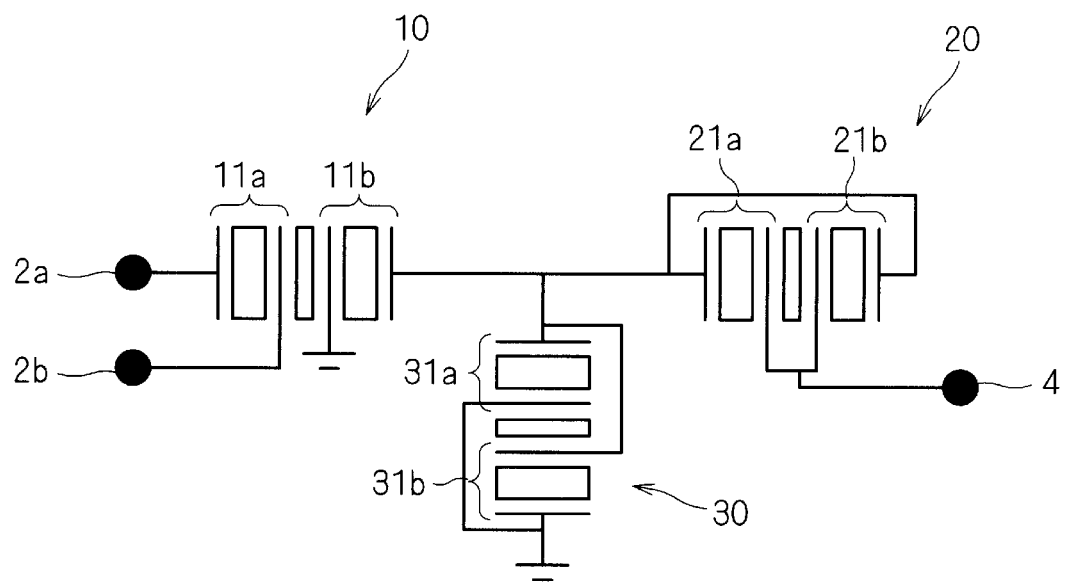
FIG. 18 illustrates electrical wiring of stacked BAW devices according to Modification 5 of a preferred embodiment of the present invention.

Modification 5 is described with reference to FIG. 18. FIG. 18 illustrates electrical wiring of stacked BAW devices according to this modification.

As illustrated in FIG. 18, a first stacked BAW device 10 is followed by second and third stacked BAW devices 20 and 30 connected therewith in a ladder arrangement in which the resonators 21a and 21b of the second stacked BAW device 20 define a series resonator for the first stacked BAW device 10, which defines a filter, and the resonators 31a and 31b of the third stacked BAW device 30 define a parallel resonator for the filter.

The constitution illustrated in FIG. 18 also achieves improved steepness both at the lower and upper edges of the filter band.

Modification 6

Figure 19:
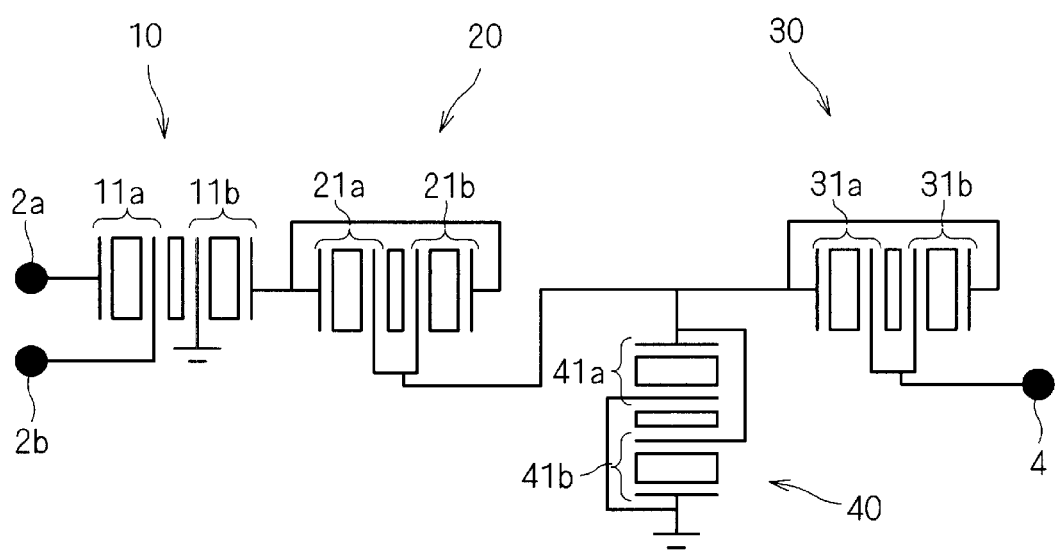
FIG. 19 illustrates electrical wiring of stacked BAW devices according to Modification 6 of a preferred embodiment of the present invention.

Modification 6 is described with reference to FIG. 19. FIG. 19 illustrates electrical wiring of stacked BAW devices according to this modification.

As illustrated in FIG. 19, a first stacked BAW device 10 is followed by second to fourth stacked BAW devices 20, 30, and 40 connected therewith in a ladder arrangement in which the resonators 21a and 21b of the second stacked BAW device 20 define a series resonator for the first stacked BAW device 10, which defines a filter, do so the resonators 31a and 31b of the third stacked BAW device 30, and the resonators 41a and 41b of the fourth stacked BAW device 40 define a parallel resonator for the filter.

The constitution illustrated in FIG. 19 also achieves improved steepness both at the lower and upper edges of the filter band.

Modification 7

Figure 20:
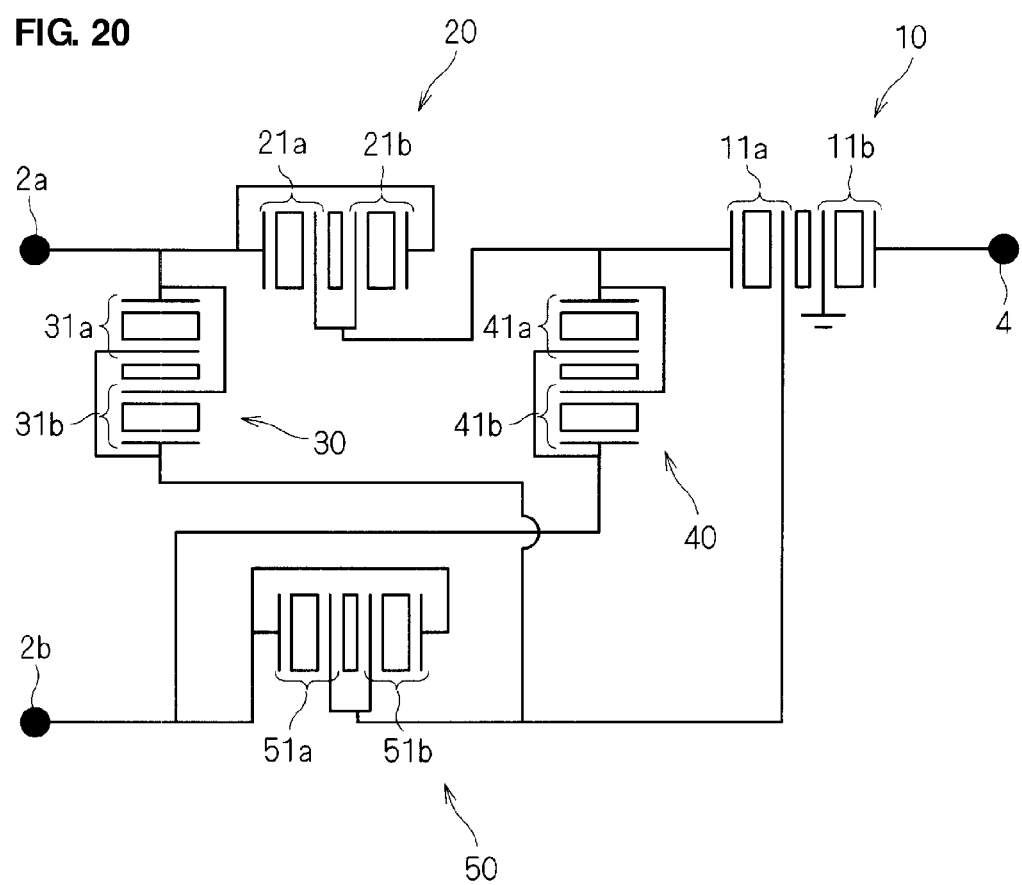
FIG. 20 illustrates electrical wiring of stacked BAW devices according to Modification 7 of a preferred embodiment of the present invention.

Modification 7 is described with reference to FIG. 20. FIG. 20 illustrates electrical wiring of stacked BAW devices according to this modification.

As illustrated in FIG. 20, a first stacked BAW device 10 follows second to fifth stacked BAW devices 20, 30, 40, and 50 connected therewith in a lattice arrangement. The stacked BAW devices on the series arms, namely the second and fifth stacked BAW devices 20 and 50, include a wiring arrangement for symmetric vibrations, whereas those on the lattice arms, namely the third and fourth stacked BAW devices 30 and 40, include a wiring arrangement for asymmetric vibrations.

The constitution illustrated in FIG. 20 provides a filter that features a reduced attenuation.

Modification 8

Figure 21:
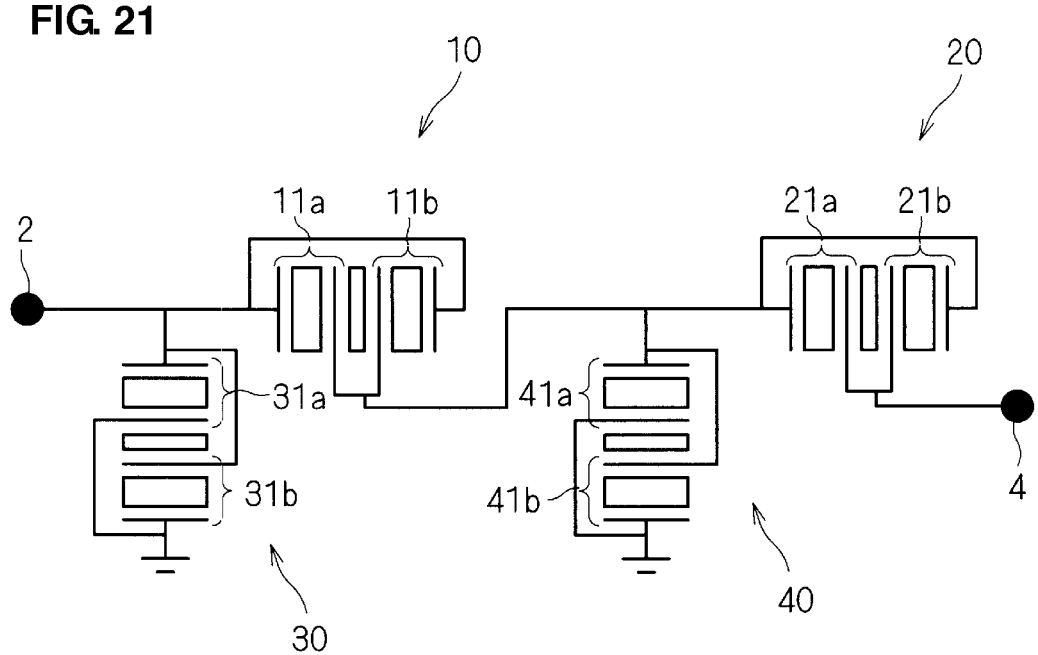
FIG. 21 illustrates electrical wiring of stacked BAW devices according to Modification 8 of a preferred embodiment of the present invention.

Modification 8 is described with reference to FIG. 21. FIG. 21 illustrates electrical wiring of stacked BAW devices according to this modification.

As illustrated in FIG. 21, first to fourth stacked BAW devices 10, 20, 30, and 40 are connected in a ladder arrangement. The stacked BAW devices on the series arm, namely the first and second stacked BAW devices 10 and 20, include a wiring arrangement for symmetric vibrations, whereas those on the parallel arms, namely the third and fourth stacked BAW devices 30 and 40, include a wiring arrangement for asymmetric vibrations.

With the first to fourth stacked BAW devices 10, 20, 30, and 40 defining resonators, the constitution illustrated in FIG. 21 eliminates the need for using monolayer BAW resonators, which would usually be needed to provide this type of circuit.

Modification 9

Figure 22:
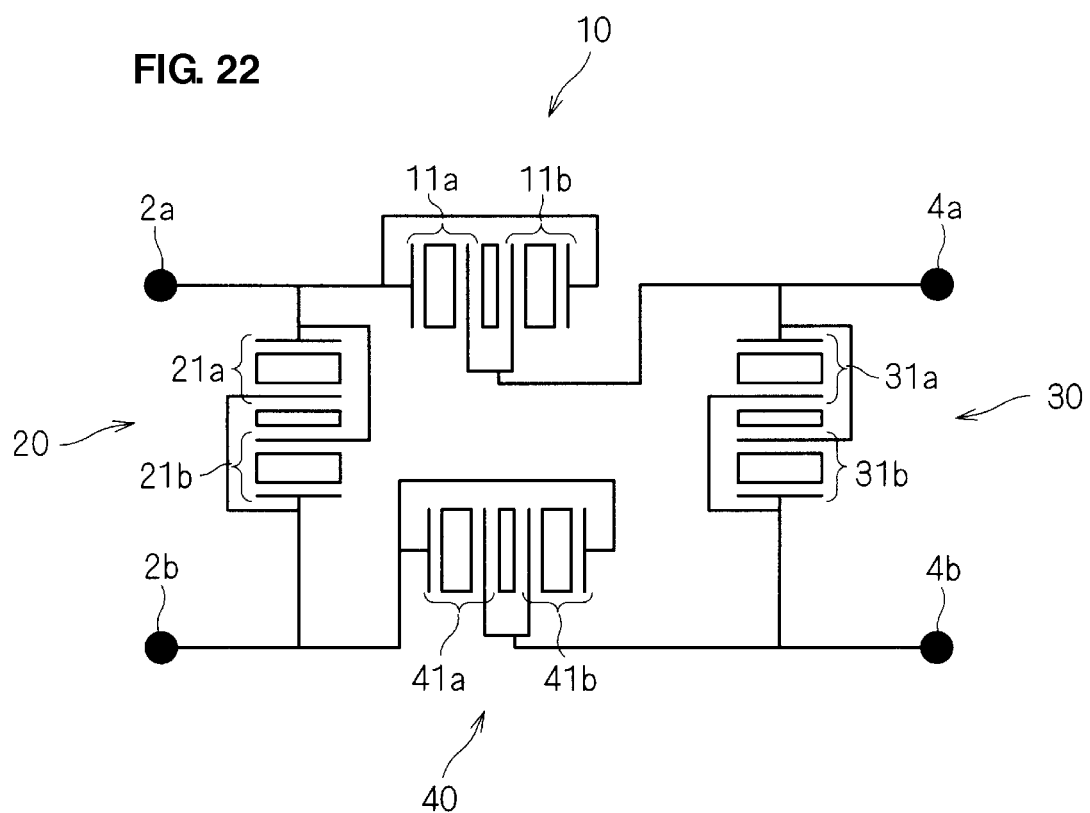
FIG. 22 illustrates electrical wiring of stacked BAW devices according to Modification 9 of a preferred embodiment of the present invention.

Modification 9 is described with reference to FIG. 22. FIG. 22 illustrates electrical wiring of stacked BAW devices according to this modification.

As illustrated in FIG. 22, first to fourth stacked BAW devices 10, 20, 30, and 40 are connected in a ladder arrangement to define a balanced ladder filter. The stacked BAW devices on the series arms, namely the first and fourth stacked BAW devices 10 and 40, include a wiring arrangement for symmetric vibrations, whereas those on the parallel arms, namely the second and third stacked BAW devices 20 and 30, include a wiring arrangement for asymmetric vibrations.

The constitution illustrated in FIG. 22 also eliminates the need for using monolayer BAW resonators, which would usually be needed to provide this type of circuit, because the first to fourth stacked BAW devices 10, 20, 30, and 40 define resonators.

Modification 10

Figure 23:
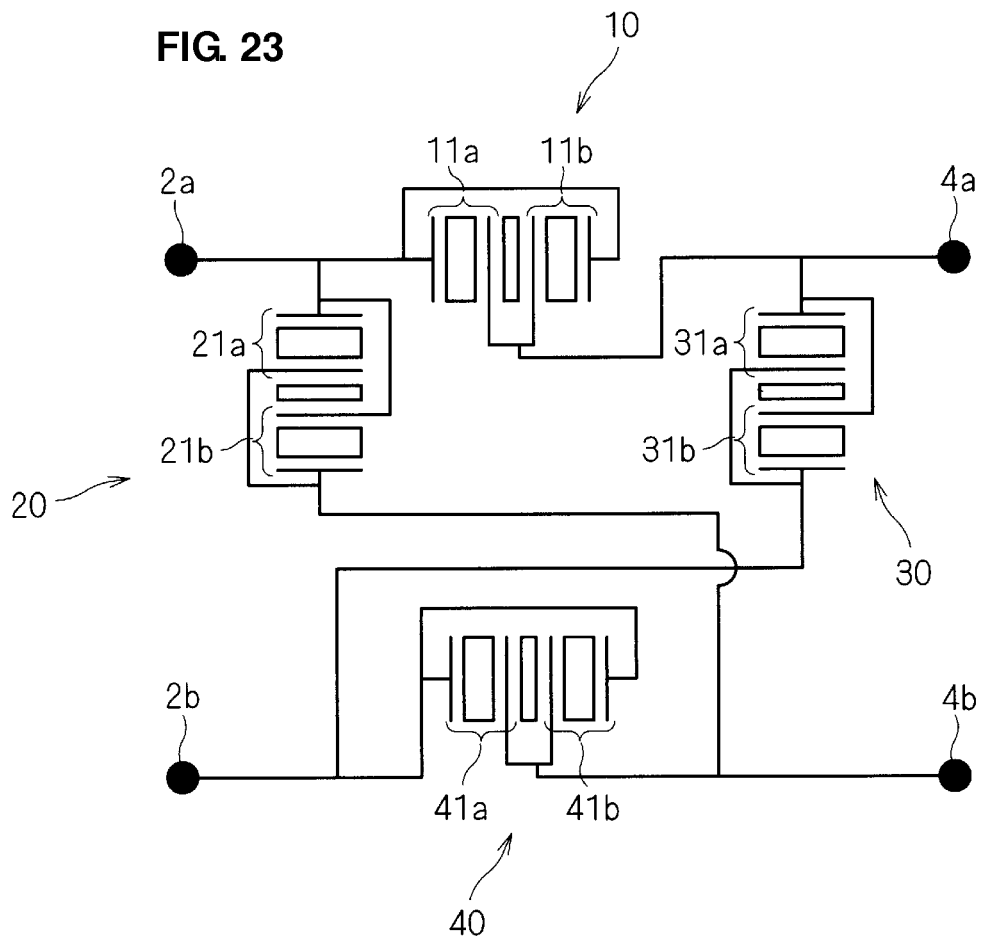
FIG. 23 illustrates electrical wiring of stacked BAW devices according to Modification 10 of a preferred embodiment of the present invention.

Modification 10 is described with reference to FIG. 23. FIG. 23 illustrates electrical wiring of stacked BAW devices according to this modification.

As illustrated in FIG. 23, first to fourth stacked BAW devices 10, 20, 30, and 40 are connected in a lattice arrangement. The stacked BAW devices on the series arms, namely the first and fourth stacked BAW devices 10 and 40, include a wiring arrangement for symmetric vibrations, whereas those on the lattice arms, namely the second and third stacked BAW devices 20 and 30, include a wiring arrangement for asymmetric vibrations.

The constitution illustrated in FIG. 23 also eliminates the need for using monolayer BAW resonators, which would usually be needed to provide this type of circuit, because the first to fourth stacked BAW devices 10, 20, 30, and 40 define resonators.

Examples

Figure 1:
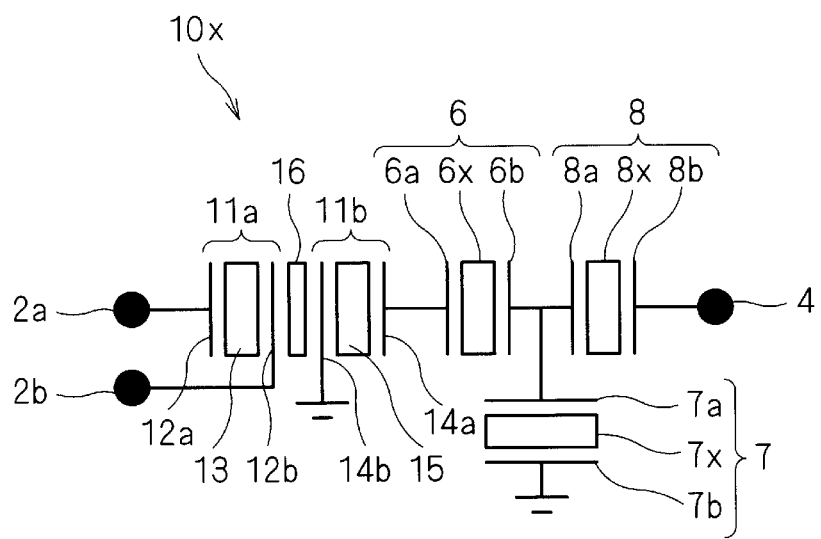
FIG. 1 illustrates a filter circuit according to Comparative Example 1.
Figure 2:
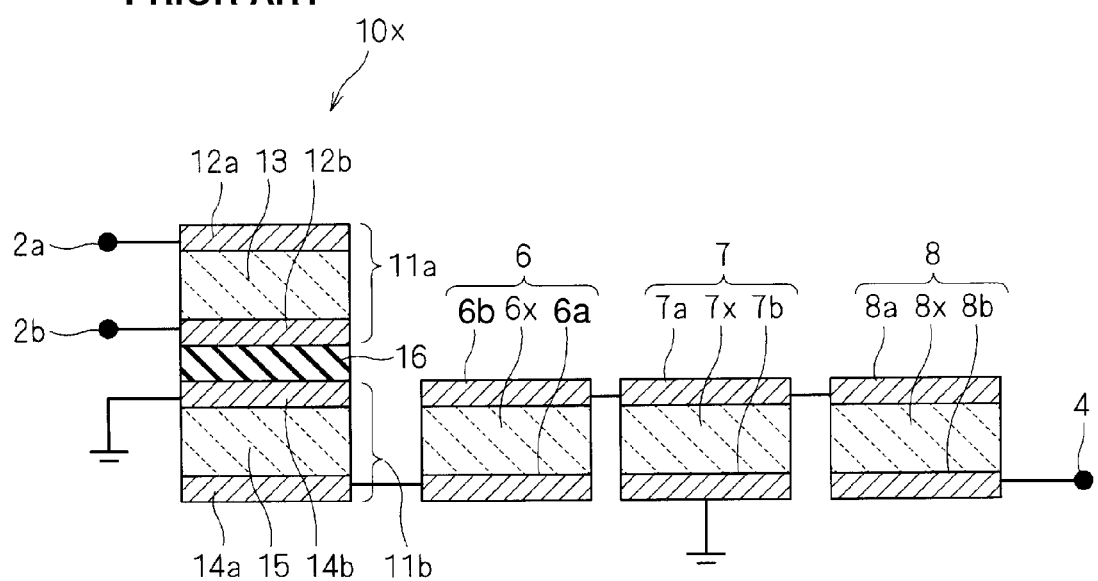
FIG. 2 illustrates a schematic cross-sectional view of this filter circuit according to Comparative Example 1.
Figure 3:
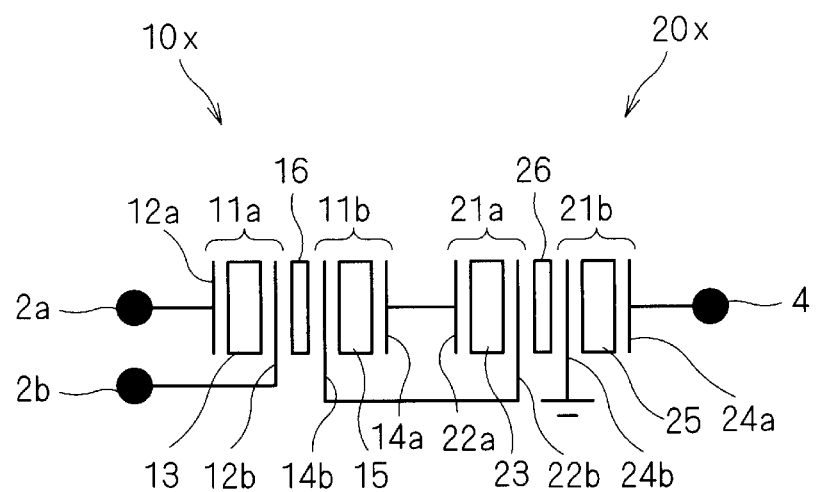
FIG. 3 illustrates a filter circuit according to Comparative Example 2.
Figure 4:
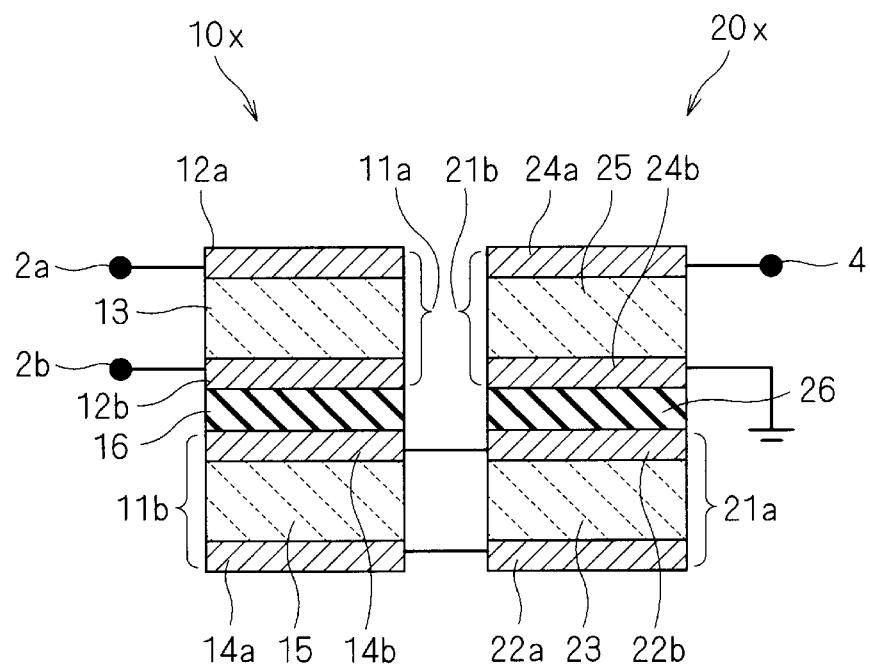
FIG. 4 illustrates a schematic cross-sectional view of this filter circuit according to Comparative Example 2.

The present inventors actually fabricated two filters, one made in accordance with Preferred Embodiment 1 and having the constitution illustrated in FIGS. 11 and 12 (Preferred Embodiment Example), and the other having the constitution illustrated in FIGS. 3 and 4 (Comparative Example).

For these examples, Table 1 below summarizes measurements from the layers of stacked BAW devices.

TABLE 1

|  | Comparative Example | Preferred Embodiment Example |
| --- | --- | --- |
| Uppermost electrode (molybdenum) | 193 nm | 435 nm |
| Upper piezoelectric thin film (aluminum nitride) | 1243 nm | 954 nm |
| Second uppermost electrode (molybdenum) | 418 nm | 334 nm |
| Acoustic coupling layer (resin) | 397 nm | 415 nm |

TABLE 1-continued

| | Comparative Example | Preferred Embodiment Example |
|---|---|---|
| Second lowermost electrode (molybdenum) | 324 nm | 351 nm |
| Lower piezoelectric thin film (aluminum nitride) | 1638 nm | 1583 nm |
| Lowermost electrode (molybdenum) | 100 nm | 100 nm |
| Total area of electrode 1 | 14040 μm² (first device) | 11002 μm² (stacked BAW filter) |
| Total area of electrode 2 | 11358 μm² (second device) | 8313 μm² (stacked BAW parallel resonator) |

The filters each included two stacked BAW devices. In both the filters, the two stacked BAW devices had substantially the same total thickness, and the thickness of the individual layers was also substantially the same between the two devices because every layer was formed in a single operation. The use of two stacked BAW devices with different thickness improves design flexibility; however, it also leads to an increased number of operations and thus was avoided in both the examples.

Figure 24:
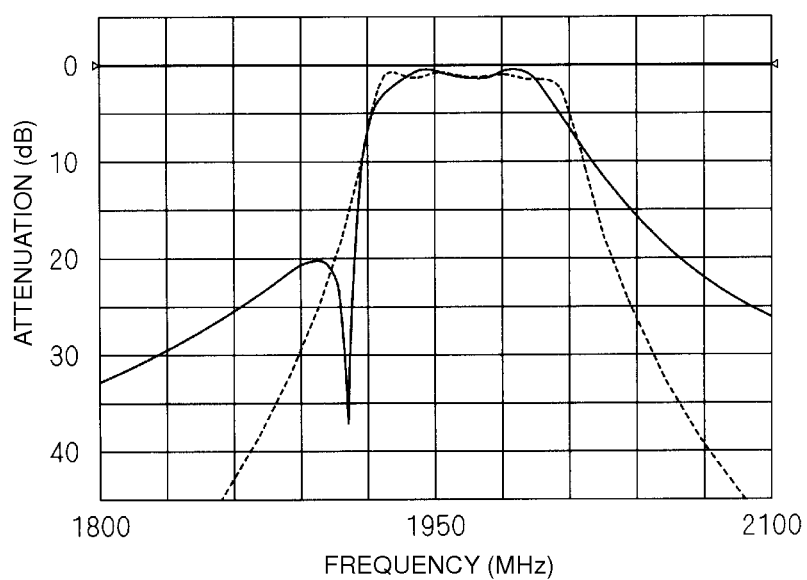
FIG. 24 illustrates frequency characteristics of the filter according to Preferred Embodiment 1 of the present invention and that according to Comparative Example 2.

FIG. 24 illustrates transmission characteristics (S21) of the filters. The solid line represents data for the filter according to the Preferred Embodiment Example, and the broken line data for the filter according to the Comparative Example.

As can be seen from FIG. 24, the filter according to the Preferred Embodiment Example was far superior to that according to the Comparative Example, a filter having two stacked BAW devices cascaded, in steepness at the lower edge of the filter band.

Preferred Embodiment 2

Figure 25:
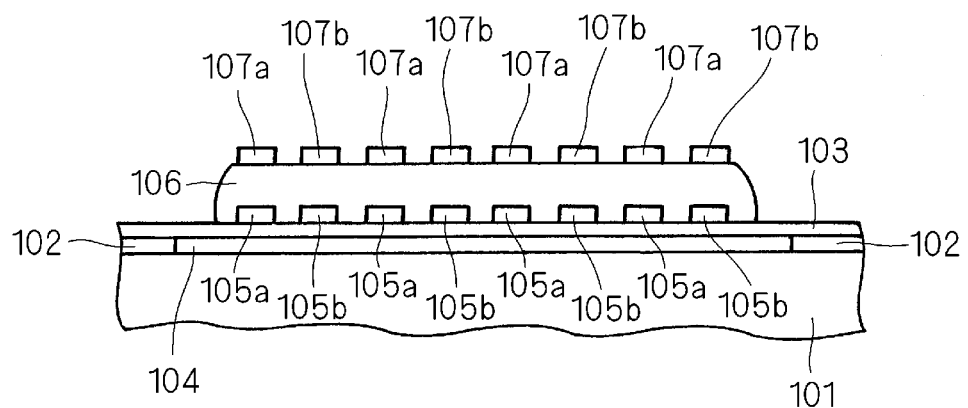
FIG. 25 illustrates a basic constitution of a flat BAW device according to Preferred Embodiment 2 of the present invention.
Figure 26:
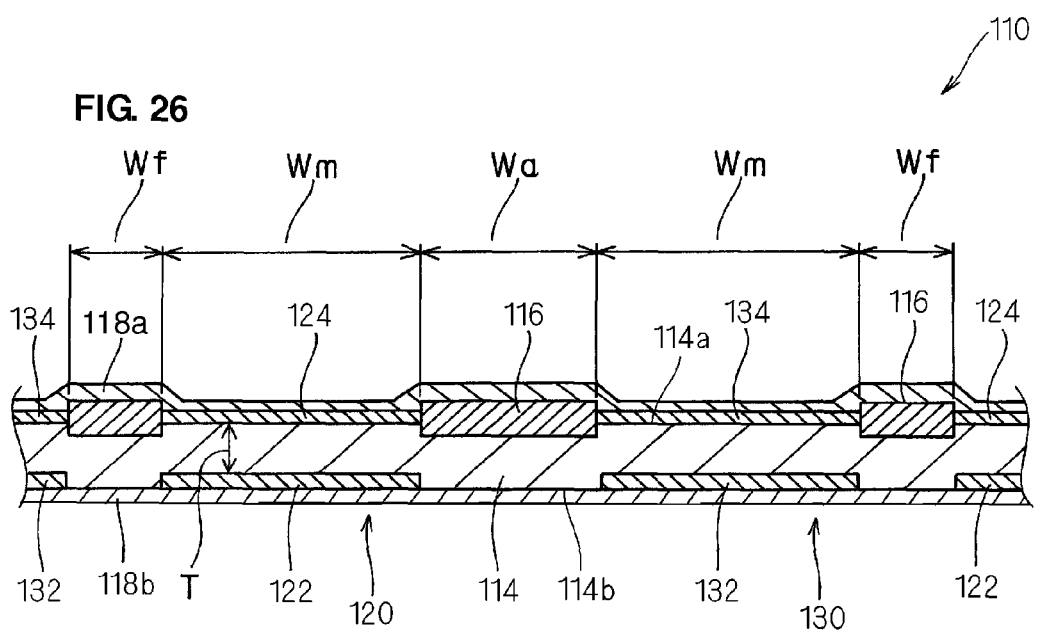
FIG. 26 illustrates a cross-sectional view of the essential portion of a flat BAW device according to Preferred Embodiment 2 of the present invention.

The following describes filters (acoustic wave devices) according to Preferred Embodiment 2 with reference to FIGS. 25 to 27.

A major element of the filters according to Preferred Embodiment 2 is a flat BAW device.

FIG. 25 illustrates a basic constitution of an appropriate type of flat BAW device. As illustrated in FIG. 25, a substrate 101 includes spacers 102 provided thereon, which support a diaphragm 103 while leaving some space 104, and a piezoelectric thin film 106 is provided on the diaphragm 103. The piezoelectric thin film 106 includes several electrode fingers 105a and 107a of a first electrode pair and several electrode fingers 105b and 107b of a second electrode pair on the two principal planes thereof. The electrode fingers provided on one of the principal planes face those on the other principal plane across the piezoelectric thin film 106. On each principal plane, the electrode fingers of the first electrode pair alternate with those of the second with a space therebetween.

For example, the electrode fingers 105a and 107a of the first electrode pair are connected to the input terminal, and the electrode fingers 105b and 107b of the second electrode pair to the output terminal. A pair of electrode fingers 105a and 107a of the first electrode pair and the piezoelectric thin film 106 constitute a resonator, and vibrations generated by this resonator are transmitted to the next resonator, which is constituted by a pair of the electrode fingers 105b and 107b of the second electrode pair and the piezoelectric thin film 106, and output in the form of electric information.

FIG. 26 illustrates a cross-sectional view of the essential portion of the flat BAW device 110 included in a filter according to Preferred Embodiment 2 in its basic constitution. Note that FIG. 26 illustrates only a single repeating unit; this device actually has some repetitions of this unit.

As illustrated in FIG. 26, a piezoelectric thin film 114 includes two principal planes 114a and 114b. The first of the principal planes includes first and second electrode fingers 124 and 122 of a first electrode pair 120 to constitute a set of resonators, and the second of the principal planes includes third and fourth electrode fingers 134 and 132 of a second electrode pair 130 to constitute another set of resonators. The two sets of resonators alternate with each other with a space therebetween.

One principal plane (the upper surface) 114a of the piezoelectric thin film 114 also includes an insulating film 116 for additional mass, each portion of which lies between the nearest first and third electrode fingers 124 and 134.

Furthermore, both the principal planes 114a and 114b of the piezoelectric thin film 114 preferably are totally covered with second insulating films 118a and 118b, respectively. More specifically, one second insulating film 118a covers the first and third electrode fingers 124 and 134 and the insulating film 116 on one principal plane 114a, and the other second insulating film 118b covers the second and fourth electrode fingers 122 and 132 on the other principal plane 114b. Either of the second insulating films 118a and 118b may be omitted, or even both the second insulating films 118a and 118b may be omitted. The material for the second insulating films 118a and 118b may be the same as or different from that for the insulating film 116, the portions of which lie between the first and third electrode fingers 124 and 134.

After the device is finished, the second insulating films 118a and 118b can be etched in order for the device frequency to be tuned. The second insulating films 118a and 118b also act as effective protectors against oxidation and corrosion for the electrode fingers 122, 124, 132, and 134.

As the electrode fingers 124 and 134 alternate with each other with the portions of the insulating film 116 provided therebetween, the center distances Wa+Wm and Wf+Wm are larger than double the thickness T of the piezoelectric thin film 114. Preferably, the width Wm of each of the electrode fingers 122, 124, 132, and 134 is larger than double the thickness T of the piezoelectric thin film 114. This allows several vibration modes to be generated.

In addition, the distances between the electrode fingers 124 and the next electrode fingers 134, namely the widths Wa and Wf of the electrodeless portions, may be equal to or different from each other.

For example, the first and second electrode fingers 124 and 122 are connected to the input terminal, and the third and fourth electrode fingers 134 and 132 are connected to the output terminal. This electrical wiring allows the filter to work as a dual-mode filter. This filter may also be used as a balanced-signal input/output filter or, when any set of the electrode fingers 124, 122, 134, and 132 is grounded to define an unbalanced terminal, as a balanced filter.

Electrical wiring of this type of flat BAW device can be arranged in the same manner as with stacked BAW devices. The same basic principle also applies to monolithic crystal filters (MCFs) and dual-mode SAW filters.

Figure 27A:
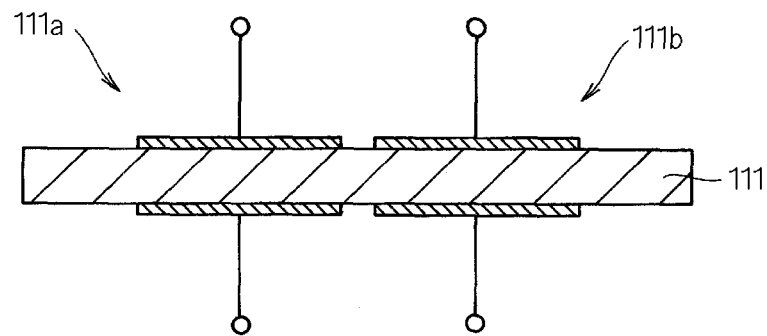
FIGS. 27A to 27C illustrate arrangements of electrical wiring of a flat BAW device according to Preferred Embodiment 2 of the present invention.
Figure 27B:
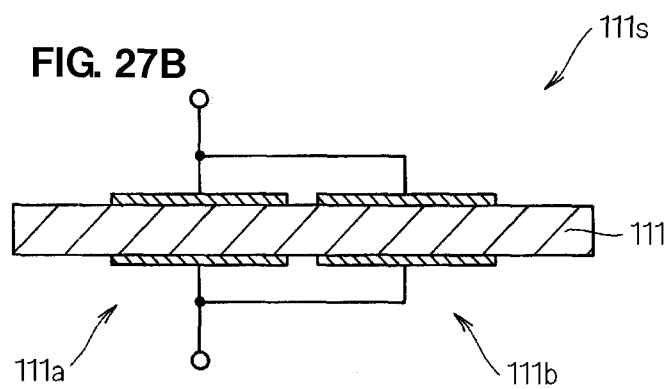
Figure 27C:
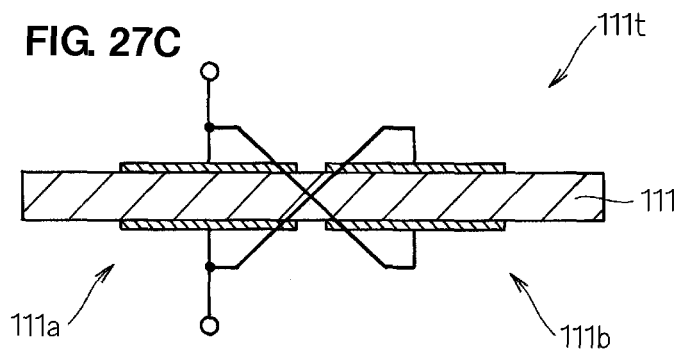

FIGS. 27A to 27C illustrate various arrangements of electrical wiring of this type of flat BAW device. When two resonators 111a and 111b are provided on a single piezoelectric film 111 as illustrated in FIG. 27A, the resonators 111a and 111b can individually work unless they are too close to each other. As these two resonators 111a and 111b come closer to each other, however, the adjacent resonators 111a and 111b come to be coupled and vibrate in both the symmetric and asymmetric modes.

FIG. 27B is a schematic view of a single repeating unit 111s of the flat BAW device in which its two resonators 111a and 111b are coupled and electrically connected for use in the symmetric mode. FIG. 27C is a schematic view of a single repeating unit 111t of the flat BAW device in which its two resonators 111a and 111b are coupled and electrically connected for use in the asymmetric mode.

With the electrical wiring illustrated in FIG. 27B for symmetric vibrations or that in FIG. 27C for asymmetric vibrations, the flat BAW device defines a monolayer BAW resonator, as stacked BAW devices do in the constitutions described above.

Thus, possible constitutions of the filters according to Preferred Embodiment 2 are preferably the same as those of the filters according to Preferred Embodiment 1; electric wiring is arranged as illustrated in any of FIGS. 11, 13, and 15 to 23, although flat BAW devices are preferably used instead of stacked BAW devices. These constitutions allow flat BAW devices alone to define a filter that achieves improved band-edge steepness.

In fabricating a filter according to Preferred Embodiment 2 with several flat BAW devices, furthermore, the devices can be formed on a single substrate in order for the whole fabrication process to be simplified.

A duplexer whose transmitting or receiving filter is a filter according to Preferred Embodiment 2 will be advantageous in that it can function as a balanced-to-unbalanced or unbalanced-to-balanced transformer making use of BAWs. In this type of duplexer, the resonators of the flat BAW devices can also define impedance matching elements for the transmitting and receiving filters in addition to their primary role as resonators.

In conclusion, various preferred embodiments of the present invention provide filters that achieve improved band-edge steepness despite being constituted only by resonator structures each based on adjacent coupled resonators.

The present invention is not limited to the preferred embodiments described above; various modifications thereto are possible.

For example, filters that are constituted by resonator structures each based on coupled resonators can work not only with BAWs generated by piezoelectric thin films but also in electrical wiring arrangements for selective excitation in one or some of the filter waveform-generating vibration modes. Besides filters, duplexers, and other types of acoustic wave devices based on BAWs, the present invention also includes those based on other resonator structures such as surface acoustic wave filters, boundary acoustic wave filters, piezoelectric ceramic bulk vibrators, and piezoelectric single crystal bulk vibrators as long as they have a circuit constitution according to any of the preferred embodiments described above.

While preferred embodiments of the invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a plurality of resonator structures each including a plurality of resonators arranged next to each other, each of the resonator structures being excited in at least two vibration modes as the resonators thereof are coupled and resonate with each other; and
two balanced input terminals and/or two balanced output terminals; wherein
at least one of the resonator structures has stronger resonance characteristics in one of the vibration modes than in the other vibration mode or modes within a filter band and defines a parallel resonator connected between the two balanced input terminals or between the two balanced output terminals or between one of the two balanced input terminals and one of the two balanced output terminals;
each of the resonators of the resonator structures is a piezoelectric thin-film resonator including a pair of electrode films and a piezoelectric thin film located between the pair of electrode films;
each of the resonator structures is a stacked bulk acoustic wave device including the piezoelectric thin-film resonators stacked in a direction of lamination of the pair of electrode films and the piezoelectric thin film; and
one of the stacked bulk acoustic wave devices is connected in series with another one of the stacked bulk acoustic wave devices on one of an input side or an output side and in parallel with yet another one of the stacked bulk acoustic wave devices on the other of the input side or the output side.

2. The acoustic wave device according to claim 1, wherein:
one or more layers of the stacked bulk acoustic wave devices is made of substantially the same material and has substantially the same thickness as the corresponding layer or layers of each other.

3. The acoustic wave device according to claim 1, wherein:
every layer of the stacked bulk acoustic wave devices except for one layer is made of substantially the same material and has substantially the same thickness as the corresponding layer of each other.

4. The acoustic wave device according to claim 1, wherein:
one or more but not all of the stacked bulk acoustic wave devices includes one or more additional layer; and
every layer of the resonator structures is made of substantially the same material and has substantially the same thickness as the corresponding layer of each other except for the additional layer or layers.

5. The acoustic wave device according to claim 1, wherein:
every layer of the stacked bulk acoustic wave devices is made of substantially the same material and has substantially the same thickness as the corresponding layer of each other.

6. The acoustic wave device according to claim 1, wherein:
the number of the piezoelectric thin-film resonators in each of the stacked bulk acoustic wave devices is two.

7. The acoustic wave device according to claim 6, wherein at least one of the stacked bulk acoustic wave devices includes:
a short circuit between an inner one of the electrode films of a first of the piezoelectric thin-film resonators and an outer one of the electrode films of a second of the piezoelectric thin-film resonators; and another short circuit between an outer one of the electrode films of the first of the piezoelectric thin-film resonators and an inner one of the electrode films of the second of the piezoelectric thin-film resonators.

8. The acoustic wave device according to claim 6, wherein at least one of the stacked bulk acoustic wave devices includes:
a short circuit between an outer one of the electrode films of a first of the piezoelectric thin-film resonators and an outer one of the electrode films of a second of the piezoelectric thin-film resonators; and
another short circuit between an inner one of the electrode films of the first of the piezoelectric thin-film resonators and an inner one of the electrode films of the second of the piezoelectric thin-film resonators.

9. The acoustic wave device according to claim 1, wherein:
the resonator structures are disposed on a single substrate.

10. The acoustic wave device according to claim 1, further comprising an unbalanced input terminal or an unbalanced output terminal.

11. A duplexer comprising:
the acoustic wave device according to claim 1 provided in at least one or both of a transmitting filter and a receiving filter thereof.

* * * * *